US011355557B2

United States Patent
Choi et al.

(10) Patent No.: US 11,355,557 B2
(45) Date of Patent: Jun. 7, 2022

(54) FOLDABLE DISPLAY APPARATUS

(71) Applicant: LG Display Co., Ltd., Seoul (KR)

(72) Inventors: Suk Choi, Hwaseong-si (KR); Sinchul Kang, Gimpo-si (KR); Miyeon Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 143 days.

(21) Appl. No.: 16/717,623

(22) Filed: Dec. 17, 2019

(65) Prior Publication Data

US 2020/0212127 A1 Jul. 2, 2020

(30) Foreign Application Priority Data

Dec. 31, 2018 (KR) .................. 10-2018-0174101

(51) Int. Cl.
  *H01L 27/32* (2006.01)
  *H01L 51/00* (2006.01)

(52) U.S. Cl.
  CPC ...... *H01L 27/3218* (2013.01); *H01L 27/3216* (2013.01); *H01L 51/0097* (2013.01); *H01L 2251/5338* (2013.01)

(58) Field of Classification Search
  CPC ............ H01L 27/3218; H01L 27/3216; H01L 51/0097; H01L 2251/5338
  See application file for complete search history.

(56) References Cited

U.S. PATENT DOCUMENTS

| 8,049,679 | B2 | 11/2011 | Park et al. |
| 10,135,032 | B2 | 11/2018 | Aiba et al. |
| 10,879,315 | B2 * | 12/2020 | Zhou .................. H01L 27/3213 |
| 2008/0198121 | A1 | 8/2008 | Park et al. |
| 2011/0122054 | A1 | 5/2011 | Shimizu et al. |
| 2011/0317429 | A1 | 12/2011 | Aiba et al. |
| 2014/0300529 | A1 | 10/2014 | Kim et al. |
| 2014/0361262 | A1 * | 12/2014 | Kim .................. H01L 27/3218 257/40 |
| 2015/0029683 | A1 * | 1/2015 | Kim .................. H01L 51/0097 361/749 |

(Continued)

FOREIGN PATENT DOCUMENTS

| CN | 203445121 U | 2/2014 |
| CN | 108898955 A | 11/2018 |
| JP | 2003-022037 A | 1/2003 |

(Continued)

OTHER PUBLICATIONS

China National Intellectual Property Administration, Office Action, CN Patent Application No. 201911223685.5, dated Jun. 10, 2021, 19 pages.

*Primary Examiner* — Fernando L Toledo
*Assistant Examiner* — Neil R Prasad
(74) *Attorney, Agent, or Firm* — Fenwick & West LLP

(57) ABSTRACT

A foldable display apparatus includes: a non-folding area, and a folding area, in which an aperture ratio of a plurality of red sub pixels in the folding area is lower than an aperture ratio of a plurality in red sub pixels of the non-folding area, an aperture ratio of the plurality of green sub pixels in the folding area is lower than an aperture ratio of the plurality of green sub pixels of the non-folding area, and an aperture ratio of the plurality in blue sub pixels of the folding area is lower than an aperture ratio of the plurality of blue sub pixels of the non-folding area.

19 Claims, 9 Drawing Sheets

(56) References Cited

U.S. PATENT DOCUMENTS

2016/0225331 A1\* 8/2016 Higano ................ G09G 3/3607
2018/0175311 A1\* 6/2018 Jin ...................... H01L 27/3258

FOREIGN PATENT DOCUMENTS

| KR | 10-2011-0134438 A | 12/2011 |
|----|-------------------|---------|
| KR | 10-1337258 B1 | 12/2013 |
| KR | 10-2016-0125593 A | 11/2016 |

\* cited by examiner

FOLDABLE DISPLAY APPARATUS

CROSS-REFERENCE TO RELATED APPLICATIONS

This application claims priority to Republic of Korea Patent Application No. 10-2018-0174101 filed on Dec. 31, 2018, in the Korean Intellectual Property Office, which is incorporated herein in its entirety.

BACKGROUND

Field

The present disclosure relates to a foldable display apparatus, and more particularly, to a foldable display apparatus in which an image display ability of a folding unit can be improved.

Description of the Related Art

Among display apparatuses which are used for a monitor of a computer, a television, or a cellular phone, there are an electroluminescent display apparatus which is a self-emitting device and a liquid crystal display device (LCD) which requires a separate light source.

The electroluminescent display apparatus may include an organic light emitting diode, an inorganic light emitting diode, a quantum-dot diode, a Perovskite LED, a micro LED, and the like, as electroluminescence elements.

Further, recently, a foldable display apparatus which is manufactured by forming a display unit and a wiring line on a flexible substrate such as plastic which is a flexible material so as to be capable of displaying images even though the display apparatus is bent like a paper is getting attention as a next generation display device.

SUMMARY

A disclosed pixel structure of a foldable display apparatus is capable of improving a reliability of pixels disposed in a folding area when the foldable display apparatus is folded.

The pixel structure is advantageous when there is a luminance difference between the pixels disposed in the folding area and the non-folding area.

When a tensile or compressive stress was generated in the folding area of the foldable display apparatus, an electrical stress may be generated in the light emitting layer of the pixel. Further, a parasitic capacitance may increase in at least one of a light emitting layer, a hole injection layer, a hole transporting layer, an electron injection layer, and/or an electron transporting layer due to the electrical stress to cause a luminance difference of the pixels disposed in the folding area and the non-folding area.

Therefore, an object to be achieved by the present disclosure is to provide a foldable display apparatus in which the luminance difference in the folding area and the non-folding area of the foldable display apparatus is reduced.

Objects of the present disclosure are not limited to the above-mentioned objects, and other objects, which are not mentioned above, can be clearly understood by those skilled in the art from the following descriptions.

According to an aspect of the present disclosure, a foldable display apparatus includes: a non-folding area in which some of a plurality of red sub pixels, a plurality of green sub pixels, and a plurality of blue sub pixels is disposed; and a folding area in which the remaining of the plurality of red sub pixels, the plurality of green sub pixels, and the plurality of blue sub pixels is disposed, in which an aperture ratio of the plurality of red sub pixels of the folding area may be lower than an aperture ratio of the plurality of red sub pixels of the non-folding area, an aperture ratio of the plurality of green sub pixels of the folding area may be lower than an aperture ratio of the plurality of green sub pixels of the non-folding area, and an aperture ratio of the plurality of blue sub pixels of the folding area may be lower than an aperture ratio of the plurality of blue sub pixels of the non-folding area.

According to another aspect of the present disclosure, a foldable display apparatus includes: a substrate including a non-folding area and a folding area; and a plurality of sub pixels which is defined in the non-folding area and the folding area on the substrate and include a plurality of light emitting diodes, in which the plurality of sub pixels may be configured to emit at least one color light, and a thickness of the plurality of light emitting diodes of the plurality of sub pixels of the folding area may be larger than a thickness of the plurality of light emitting diodes of the plurality of sub pixels of the non-folding area which emits corresponding color light.

According to still another aspect of the present disclosure, a foldable display apparatus includes: a non-folding area in which some of a plurality of sub pixels including light emitting layers is disposed; and a folding area in which the remaining of the plurality of sub pixels is disposed, in which an aperture ratio of the plurality of sub pixels of the folding area may be lower than an aperture ratio of the plurality of sub pixels of the non-folding area, and a thickness of the light emitting layers of the plurality of sub pixels of the folding area may be larger than a thickness of the plurality of light emitting layers of the plurality of sub pixels of the non-folding area.

Other detailed matters of the exemplary embodiments are included in the detailed description and the drawings.

According to the present disclosure, the thickness of the light emitting layer of the pixel of the folding area and the thickness of the light emitting layer of the pixel of the non-folding area are set to be different to reduce the luminance deviation.

Further, according to the present disclosure, an aperture ratio of the pixel of the folding area and an aperture ratio of the pixel of the non-folding area are set to be different to reduce the luminance deviation.

According to some embodiments, a foldable display apparatus includes a substrate including a folding area and a plurality of sub pixels on the substrate. The plurality of sub pixels include a plurality of red sub pixels, a plurality of green sub pixels, and a plurality of blue sub pixels. At least one of the plurality of red sub pixels, the plurality of green sub pixels, or the plurality of blue sub pixels includes a first subset of sub pixels disposed in an area outside the folding area with a first aperture ratio, and a second subset of sub pixels disposed in the folding area with a second aperture ratio lower than the first aperture ratio.

According to some embodiments, a foldable display apparatus includes a substrate including a folding area and a plurality of sub pixels on the substrate. The plurality of sub pixels include a first subset of sub pixels in an area outside the folding area on the substrate. The first subset of sub pixels are configured to emit a color of light. The plurality of sub pixels also include a second subset of sub pixels in the folding area on the substrate. The second subset of sub pixels are configured to emit the color of light. Each of the plurality of sub pixels include a light emitting diode. A second thickness of the light emitting diodes of the second subset of sub pixels in the folding area is larger than a first thickness of the light emitting diodes of the first subset of sub pixels in the area outside the folding area.

According to some embodiments, a foldable display apparatus includes a substrate including a folding area and a plurality of sub pixels on the substrate. The plurality of subpixels include a first subset of sub pixels in an area outside the folding area on the substrate and a second subset of sub pixels in the folding area on the substrate. The first subset of sub pixels is configured to emit a color of light, and the second subset of sub pixels is configured to emit the color of light. Each of the plurality of sub pixels includes an anode, a cathode, and a light emitting layer between the anode and the cathode. A first capacitance between the anodes and the cathodes of the first subset of sub pixels is greater than a second capacitance between the anodes and the cathodes of the second subset of sub pixels.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE EMBODIMENT

Figure 1:
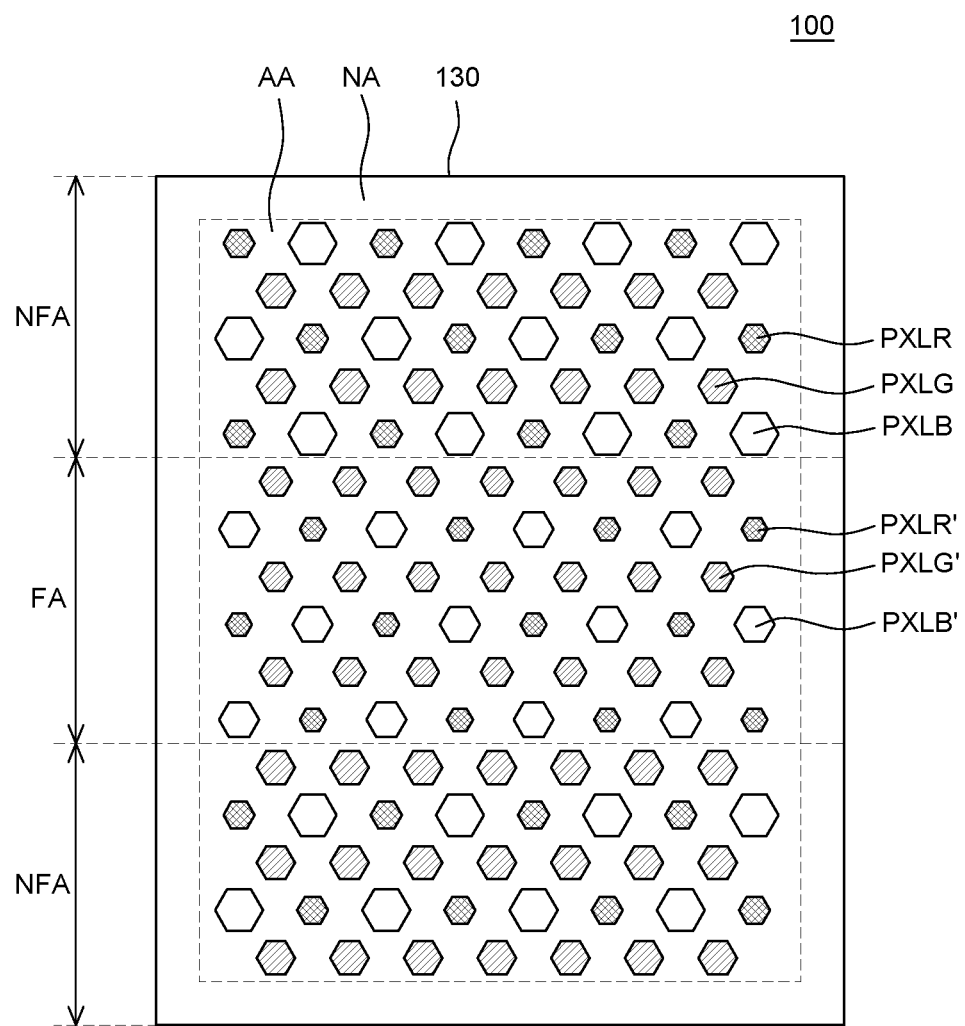
FIG. 1 is a plan view of a foldable display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a foldable display apparatus according to exemplary embodiments of the present disclosure will be described in detail with reference to accompanying drawings.

FIG. 1 is a plan view of a foldable display apparatus according to an exemplary embodiment of the present disclosure.

A foldable display panel 130 is a panel in which images are implemented. A plurality of pixels for implementing images and circuits, wiring lines, components, and the like, for driving the plurality of pixels may be disposed in the display panel.

The foldable display panel 130 includes an active area AA and a non-active area NA.

In the active area AA, images are displayed and a plurality of pixels is disposed. In the active area AA, a plurality of pixels for displaying images may be disposed. For example, when the foldable display apparatus 100 is an electroluminescent display apparatus, the pixel may include an electroluminescent element. Hereinafter, for the convenience of description, it is assumed that the foldable display apparatus 100 according to various exemplary embodiments of the present disclosure is a foldable display apparatus 100 including an electroluminescent element, but the present disclosure is not limited thereto.

The pixel may include various thin film transistors, capacitors, wiring lines, and the like, for driving the electroluminescent elements. For example, the pixel may include various configurations such as a driving thin film transistor, a switching thin film transistor, a storage capacitor, a gate line, and a data line, but are not limited thereto.

In the non-active area NA, the images are not displayed and circuits, wiring lines, components, and the like, for driving the pixels of the active area AA are disposed. In the non-active area NA, various ICs such as a gate driver IC and a data driver IC and driving circuits may be disposed. For example, various ICs and the driving circuits may be formed in the non-active area NA of the foldable display panel 130 in a gate in panel (GIP) manner or connected to the foldable display panel 130 by a tape carrier package (TCP) or a chip on film (COF) manner.

In the meantime, the foldable display panel 130 may also include a folding area FA and a non-folding area NFA.

The folding area FA is an area where the foldable display panel 130 is folded and includes the active area AA and a part of the non-active area NA.

In the non-folding area NFA, the foldable display panel 130 maintains a flat state. The non-folding area NFA includes the active area AA and another part of the non-active area NA. The non-folding area NFA may be an area outside of the folding area FA.

The non-folding area NFA is disposed at both sides of the folding area FA. That is, the non-folding areas NFA may extend to both side surfaces of the folding area FA. Further, when the foldable display panel 130 is folded, the non-folding area NFA disposed at both sides may be opposite to each other.

The foldable display apparatus 100 may be in-folded and/or out-folded with respect to a folding axis.

When the foldable display apparatus 100 is in-folded, front surfaces of the non-folding area NFA of the foldable display apparatus 100 may be folded to be opposite to each other. When the foldable display apparatus 100 is out-folded, rear surfaces of the non-folding area NFA of the foldable display apparatus 100 may be folded to be opposite to each other.

The pixels may include a red sub pixel PXLR, a green sub pixel PXLG, and a blue sub pixel PXLB.

Sub pixels disposed in the active area AA may be connected to a plurality of scan signal lines, data lines, high-potential power lines, and the like.

The sub pixel may include a light emitting diode, a transistor, and a capacitor to display images.

For example, one sub pixel may include a driving transistor, a switching transistor, a storage capacitor, and a light emitting diode. The sub pixel may be connected to a scan line, a data line, and a high potential power line.

For example, the light emitting diode of the sub pixel may be an organic light emitting diode. However, the present disclosure is not limited thereto and the light emitting diode may be implemented by various light emitting diodes. The light emitting diode may include an anode electrode connected to a driving transistor, a light emitting layer formed on the anode electrode, and a cathode electrode formed on the light emitting layer.

According to one exemplary embodiment of the present disclosure, an aperture ratio of sub pixels of the folding area FA may be configured to be relatively lower than an aperture ratio of sub pixels of the non-folding area NFA. According to some embodiments, the aperture ratio of a sub pixel indicates the ratio between a light emitting area and an area of the sub pixel.

An aperture ratio of the red sub pixel PXLR of the non-folding area NFA may be higher than an aperture ratio of the red sub pixel PXLR' of the folding area FA.

An aperture ratio of the green sub pixel PXLG of the non-folding area NFA may be higher than an aperture ratio of the green sub pixel PXLG' of the folding area FA.

An aperture ratio of the blue sub pixel PXLB of the non-folding area NFA may be higher than an aperture ratio of the blue sub pixel PXLB' of the folding area FA.

When the aperture ratio of the sub pixels disposed in the folding area FA in which the stress of each sub pixel is increased is reduced, a light emitting area of each sub pixel is reduced so that a parasitic capacitance between the anode and the cathode due to the stress may be reduced. Therefore, the luminance lowering problem which may occur in the folding area FA may be improved.

For example, the aperture ratio of the red sub pixel PXLR of the non-folding area NFA may be 13%, but the present disclosure is not limited thereto. In this case, the aperture ratio of the red sub pixel PXLR' of the folding area FA may be 11.7% to 12.8%. According to the above-described configuration, even though the aperture ratio of the folding area FA is reduced, the parasitic capacitance between the anode and the cathode in the red sub pixel PXLR' of the folding area FA is reduced. Therefore, the luminance difference between the red sub pixels in the folding area FA and the red sub pixels in the non-folding area NFA may be reduced.

For example, the aperture ratio of the green sub pixel PXLG of the non-folding area NFA may be 23%, but the present disclosure is not limited thereto. In this case, the aperture ratio of the green sub pixel PXLG' of the folding area FA may be 21.2% to 22.35%. According to the above-described configuration, even though the aperture ratio of the folding area FA is reduced, the parasitic capacitance between the anode and the cathode in the green sub pixel PXLG' of the folding area FA is reduced. Therefore, the luminance difference between the green sub pixels in the folding area FA and the green sub pixels in the non-folding area NFA may be reduced.

For example, the aperture ratio of the blue sub pixel PXLB of the non-folding area NFA may be 25.7%, but the present disclosure is not limited thereto. In this case, the aperture ratio of the blue sub pixel PXLB' of the folding area FA may be 23.5% to 25%. According to the above-described configuration, even though the aperture ratio of the folding area FA is reduced, the parasitic capacitance between the anode and the cathode in the blue sub pixel PXLB' of the folding area FA is reduced. Therefore, the luminance difference between the blue sub pixels in the folding area FA and the green sub pixels in the non-folding area NFA may be reduced.

That is, when the aperture ratio of the sub pixels of the folding area is reduced, the parasitic capacitance may be reduced so that the luminance reduction may not be as significant. According to some embodiments, a second subset of the sub pixels in an area outside the folding area has a second aperture ratio less than a first aperture ratio of a first subset of the sub pixels in the folding area.

Figure 2:
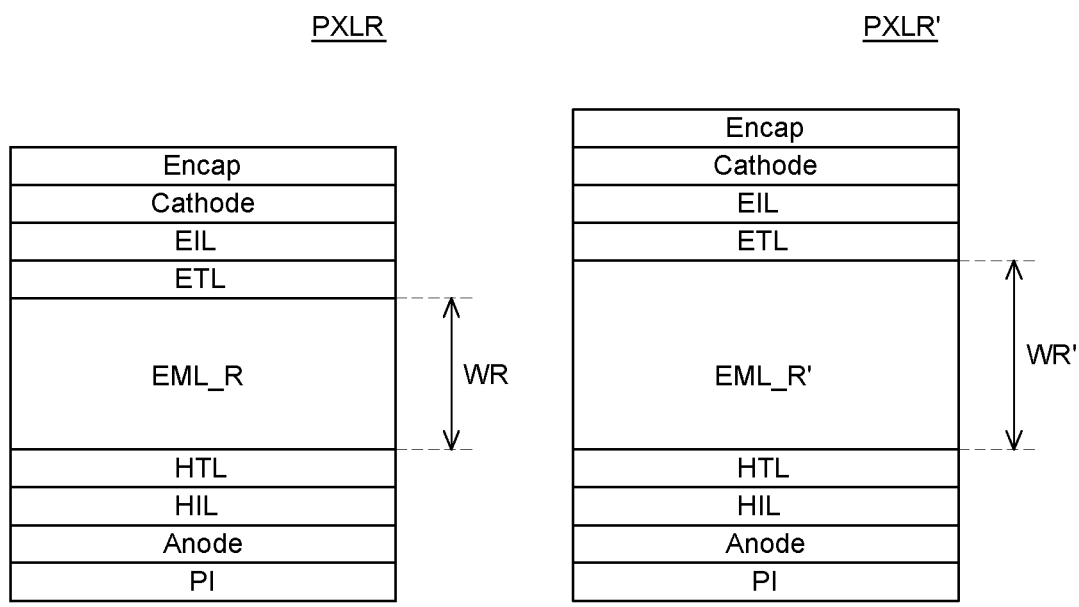
FIG. 2 is a cross-sectional view illustrating a structure of red sub pixels of a folding area and a non-folding area of FIG. 1.
Figure 3:
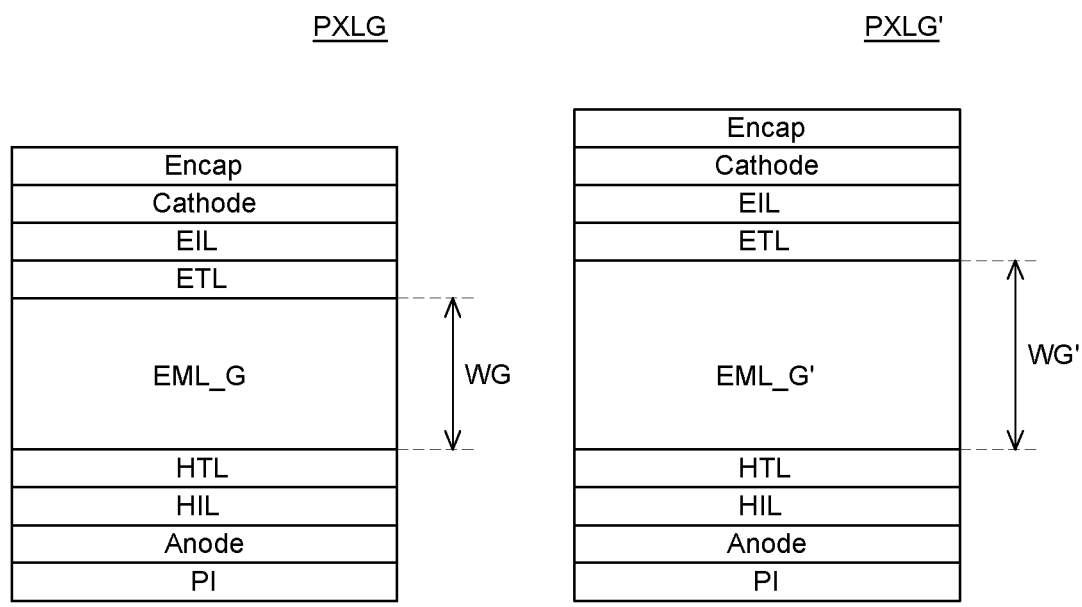
FIG. 3 is a cross-sectional view illustrating a structure of green sub pixels of a folding area and a non-folding area of FIG. 1.
Figure 4:
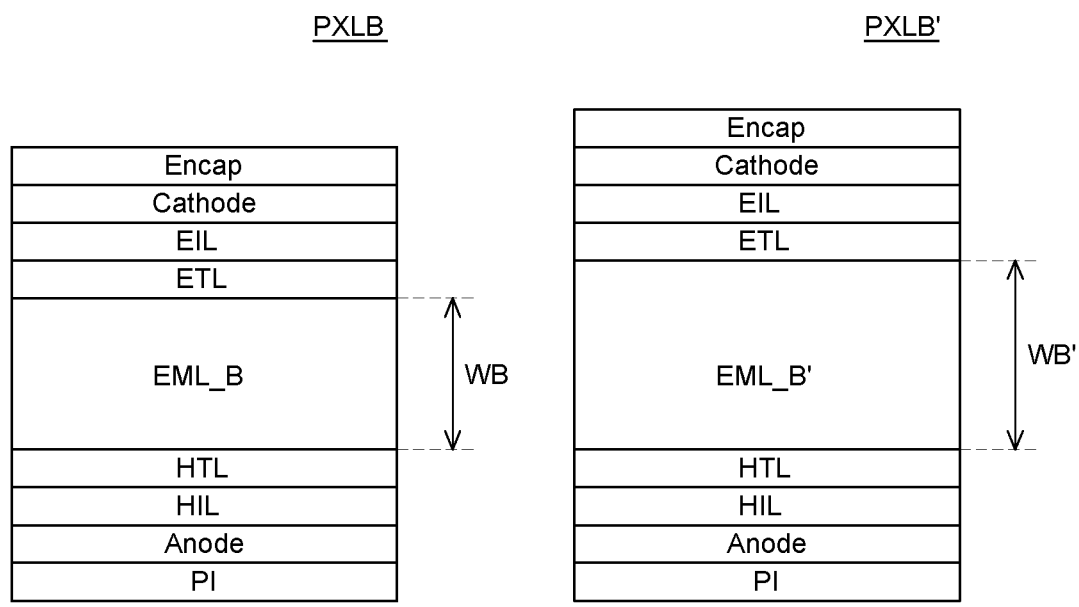
FIG. 4 is a cross-sectional view illustrating a structure of blue sub pixels of a folding area and a non-folding area of FIG. 1.

FIG. 2 is a cross-sectional view illustrating a structure of red sub pixels of a folding area and a non-folding area of FIG. 1. FIG. 3 is a cross-sectional view illustrating a structure of green sub pixels of a folding area and a non-folding area of FIG. 1. FIG. 4 is a cross-sectional view illustrating a structure of blue sub pixels of a folding area and a non-folding area of FIG. 1.

For example, each sub pixel may include a substrate PI and a light emitting diode on the substrate PI. The light emitting diode may include a structure in which an anode, a hole injection layer HIL on the anode, a hole transporting layer HTL on the hole injection layer HIL, a light emitting layer EML on the hole transporting layer HTL, an electron transporting layer ETL on the light emitting layer EML, an electron injection layer EIL on the electron transporting layer ETL, a cathode on the electron injection layer EIL, and an encapsulating layer Encap on the cathode are sequentially laminated.

The light emitting layer includes a dopant or a host having a color corresponding to each sub pixel to emit light of a specific color.

A folding stress of the substrate PI of the foldable display panel 130 may cause electrical stress one the sub pixel. Therefore, an area of the anode and the cathode of the sub pixel may increase due to the folding stress and thus the parasitic capacitance is increased so that the mobility of the electron from the cathode is reduced, resulting in degradation of the luminance. Further, the holes are trapped by the hole injection layer HIL to cause the luminance degradation. Alternatively, the exciton generated in the light emitting layer EML is reduced due to imbalance of the supplied electrons and holes so that the luminance may be degraded.

The red sub pixel PXLR of the non-folding area NFA may be configured to include a red light emitting layer EML_R having a first thickness WR. The red sub pixel PXLR' of the folding area FA may be configured to include a red light emitting layer EML_R' having a second thickness WR' which is larger than the first thickness WR.

The green sub pixel PXLG of the non-folding area NFA may be configured to include a green light emitting layer EML_G having a first thickness WG. The green sub pixel PXLG' of the folding area FA may be configured to include a green light emitting layer EML_G' having a second thickness WG' which is larger than the first thickness WG.

The blue sub pixel PXLB of the non-folding area NFA may be configured to include a blue light emitting layer EML_B having a first thickness WB. The blue sub pixel PXLB' of the folding area FA may be configured to include a blue light emitting layer EML_B' having a second thickness WB' which is larger than the first thickness WB.

When the thickness of the light emitting layer of the sub pixels disposed in the folding area FA is increased, a thickness of each sub pixel is increased so that the parasitic capacitance between the anode and the cathode due to the folding stress may be reduced. Therefore, the luminance lowering problem which may occur in the folding area FA may be reduced. According to some embodiments, a second thickness of the light emitting diodes of a second subset of the plurality of sub pixels in the folding area is larger than a first thickness of the light emitting diodes of a first subset of the plurality of sub pixels in an area outside the folding area.

For example, the thickness WR of the red sub light emitting layer EML_R of the non-folding area NFA may be 45 nm, but the present disclosure is not limited thereto. In this case, the thickness of the red light emitting layer EML_R' of the folding area FA may be 49.4 nm to 53.55 nm. According to the above-described configuration, even though the thickness of the light emitting layer in the folding area FA is increased, the parasitic capacitance between the anode and the cathode in the green sub pixel PXLG' of the folding area FA is reduced. Therefore, the luminance difference between the red subpixels in the folding area FA and the red subpixels in the non-folding area NFA may be reduced.

For example, the thickness WG of the green sub light emitting layer EML_G of the non-folding area NFA may be 40 nm, but the present disclosure is not limited thereto. In this case, the thickness WG' of the green light emitting layer EML_G' of the folding area FA may be 43.3 nm to 44 nm. According to the above-described configuration, even though the thickness of the light emitting layer in the folding area FA is increased, the parasitic capacitance between the anode and the cathode in the green sub pixel PXLG' of the folding area FA is reduced. Therefore, the luminance difference between the green sub pixels in the folding area FA and the green sub pixels in the non-folding area NFA may be reduced.

For example, the thickness WB of the blue sub light emitting layer EML_B of the non-folding area NFA may be 23 nm, but the present disclosure is not limited thereto. In this case, the thickness WB' of the blue light emitting layer EML_B' of the folding area FA may be 23 nm to 27 nm. According to the above-described configuration, even though the thickness of the light emitting layer in the folding area FA is increased, the parasitic capacitance between the anode and the cathode in the blue sub pixel PXLB' of the folding area FA is reduced. Therefore, the luminance difference between the blue sub pixels in the folding area FA and the blue sub pixels in the non-folding area NFA may be reduced.

For example, a difference of average thicknesses of sub pixels of the folding area FA and the non-folding area NFA may be about 8% to 12% so that the thickness in the folding area FA is thicker than that in the non-folding area NFA.

That is, when the thickness of the light emitting layer of the folding area is increased, the parasitic capacitance between the anode and the cathode may be reduced so that the luminance reduction may not be substantially recognized.

Figure 5:
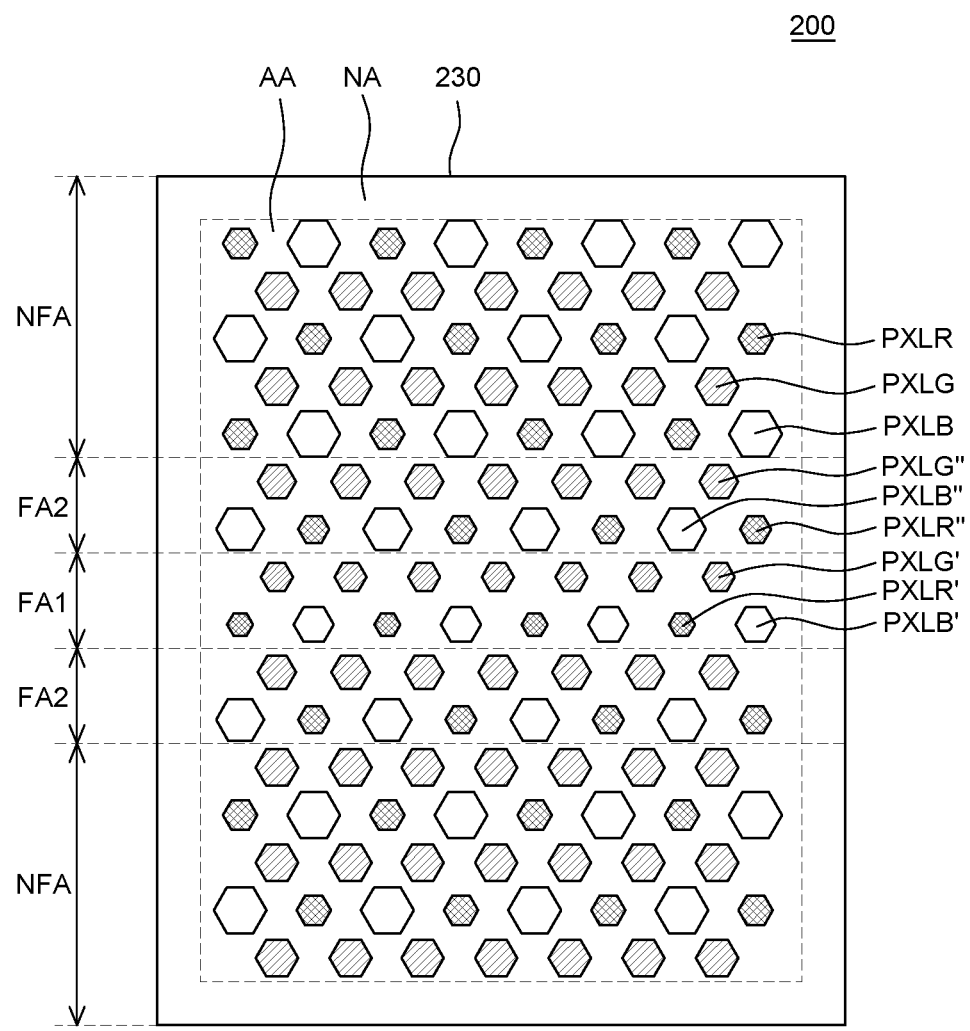
FIG. 5 is a plan view of a foldable display apparatus according to another exemplary embodiment of the present disclosure.

FIG. 5 is a plan view of a foldable display apparatus according to another exemplary embodiment of the present disclosure.

A foldable display apparatus 200 and the display panel 230 according to another exemplary embodiment of the present disclosure has substantially the same configuration as the foldable display apparatus 100 according to one exemplary embodiment of the present disclosure. Therefore, for the convenience of description, a redundant description will be omitted.

As compared with the foldable display apparatus 100 according to one exemplary embodiment of the present disclosure, in the foldable display apparatus 200 according to another exemplary embodiment of the present disclosure, the folding area FA is divided into a plurality of folding areas in accordance with the strength of the folding stress.

Specifically, the folding area FA may be divided into a first folding area FA1 and a second folding area FA2, but the present disclosure is not limited thereto and the number of folding areas may be two or larger. According to some embodiments, the second folding area FA2 may be between the first folding area FA1 and an area outside the folding area.

Specifically, the second folding area FA2 is a folding area adjacent to the non-folding area NFA and the folding stress of the second folding area FA2 is weaker than that of the first folding area FA1.

According to another exemplary embodiment of the present disclosure, an aperture ratio of sub pixels of the first folding area FA1 may be configured to be relatively lower than an aperture ratio of sub pixels of the non-folding area NFA.

An aperture ratio of the red sub pixel PXLR of the non-folding area NFA may be higher than an aperture ratio of the red sub pixel PXLR" of the second folding area FA2. Further, an aperture ratio of the red sub pixel PXLR" of the second folding area FA2 may be higher than an aperture ratio of the red sub pixel PXLR' of the first folding area FA1.

An aperture ratio of the green sub pixel PXLG of the non-folding area NFA may be higher than an aperture ratio of the green sub pixel PXLG" of the second folding area FA2. Further, an aperture ratio of the green sub pixel PXLG" of the second folding area FA2 may be higher than an aperture ratio of the green sub pixel PXLG' of the first folding area FA1.

An aperture ratio of the blue sub pixel PXLB of the non-folding area NFA may be higher than an aperture ratio of the blue sub pixel PXLB" of the second folding area FA2. Further, an aperture ratio of the blue sub pixel PXLB" of the second folding area FA2 may be higher than an aperture ratio of the blue sub pixel PXLB' of the first folding area FA1.

When the aperture of the sub pixels disposed in the first and second folding areas FA1 and FA2 is reduced in accordance with the strength of the stress, a light emitting area of each sub pixel is reduced so that the parasitic capacitance due to the stress may be reduced. Therefore, the luminance lowering problem which may be generated in the first and second folding areas FA1 and FA2 may be reduced.

For example, the aperture ratio of the red sub pixel PXLR of the non-folding area NFA may be 13%, but the present disclosure is not limited thereto. In this case, the aperture ratio of the red sub pixel PXLR" of the second folding area FA2 may be 12.3% to 12.8%. Further, the aperture ratio of the red sub pixel PXLR' of the first folding area FA1 may be 11.7% to 12.3%. According to the above-described configuration, even though the aperture ratio is individually reduced in the first and second folding areas FA1 and FA2, the luminance difference of the first and second folding areas FA1 and FA2 and the non-folding area NFA may not be substantially recognized.

For example, the aperture ratio of the green sub pixel PXLG of the non-folding area NFA may be 23%, but the present disclosure is not limited thereto. In this case, the aperture ratio of the green sub pixel PXLG" of the second folding area FA2 may be 21.7% to 22.35%. Further, the aperture ratio of the green sub pixel PXLG' of the first folding area FA1 may be 21.2% to 21.6%. According to the above-described configuration, even though the aperture ratio is individually reduced in the first and second folding areas FA1 and FA2, the luminance difference of the first and second folding areas FA1 and FA2 and the non-folding area NFA may not be substantially recognized.

For example, the aperture ratio of the blue sub pixel PXLB of the non-folding area NFA may be 25.7%, but the present disclosure is not limited thereto. In this case, the aperture ratio of the blue sub pixel PXLB" of the second folding area FA2 may be 24.2% to 25%. Further, the aperture ratio of the blue sub pixel PXLB' of the first folding area FA1 may be 23.5% to 24.2%. According to the above-described configuration, even though the aperture ratio is individually reduced in the first and second folding areas FA1 and FA2, the luminance difference of the first and second folding areas FA1 and FA2 and the non-folding area NFA may not be substantially recognized.

That is, when the aperture ratio of the sub pixels of the folding area is reduced in accordance to the strength of the folding stress, the parasitic capacitance between the anode and the cathode may be reduced in accordance to the strength of the folding stress. Therefore, the luminance reduction may not be substantially recognized.

Figure 6:
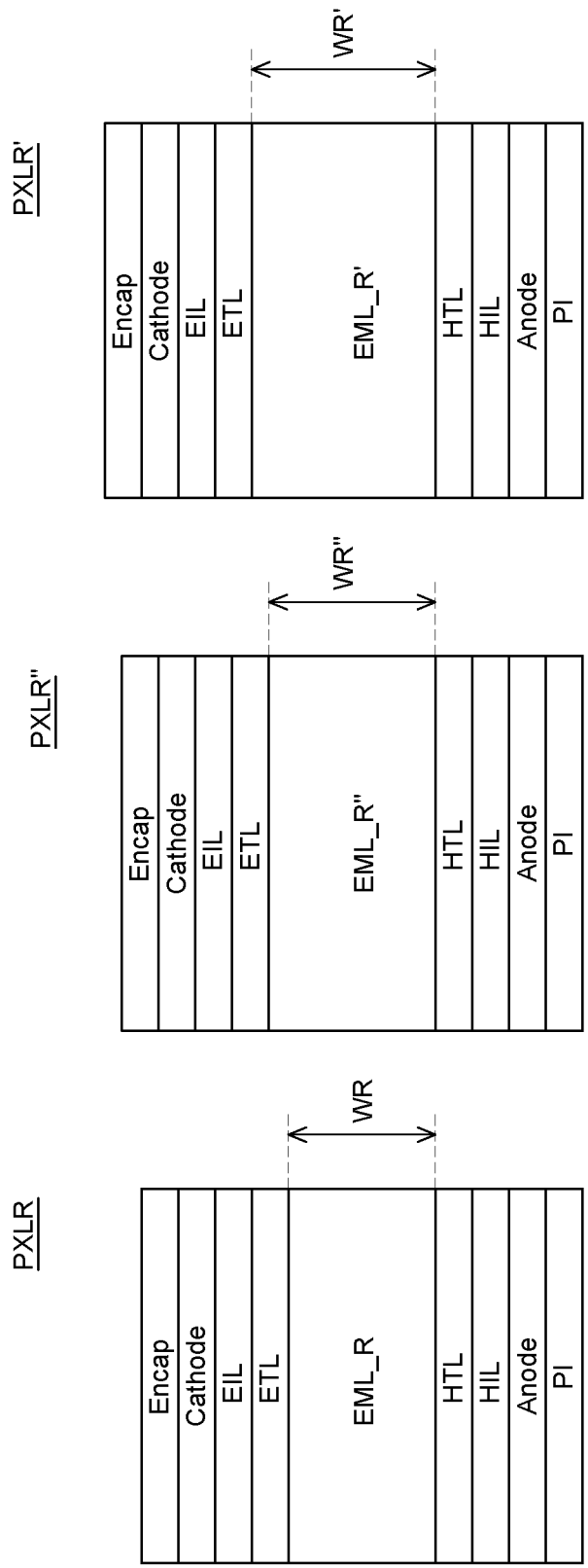
FIG. 6 is a cross-sectional view for explaining a structure of red sub pixels of a first folding area, a second folding area, and a non-folding area of FIG. 5.
Figure 7:
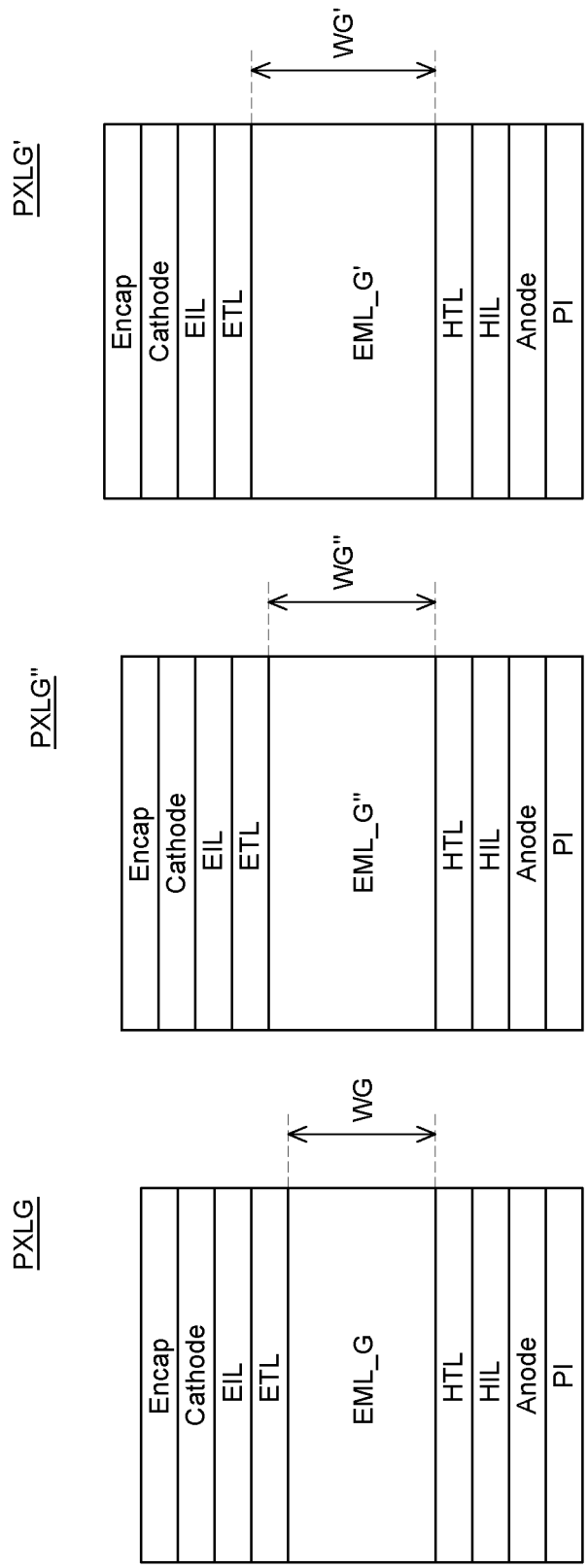
FIG. 7 is a cross-sectional view for explaining a structure of green sub pixels of a first folding area, a second folding area, and a non-folding area of FIG. 5.
Figure 8:
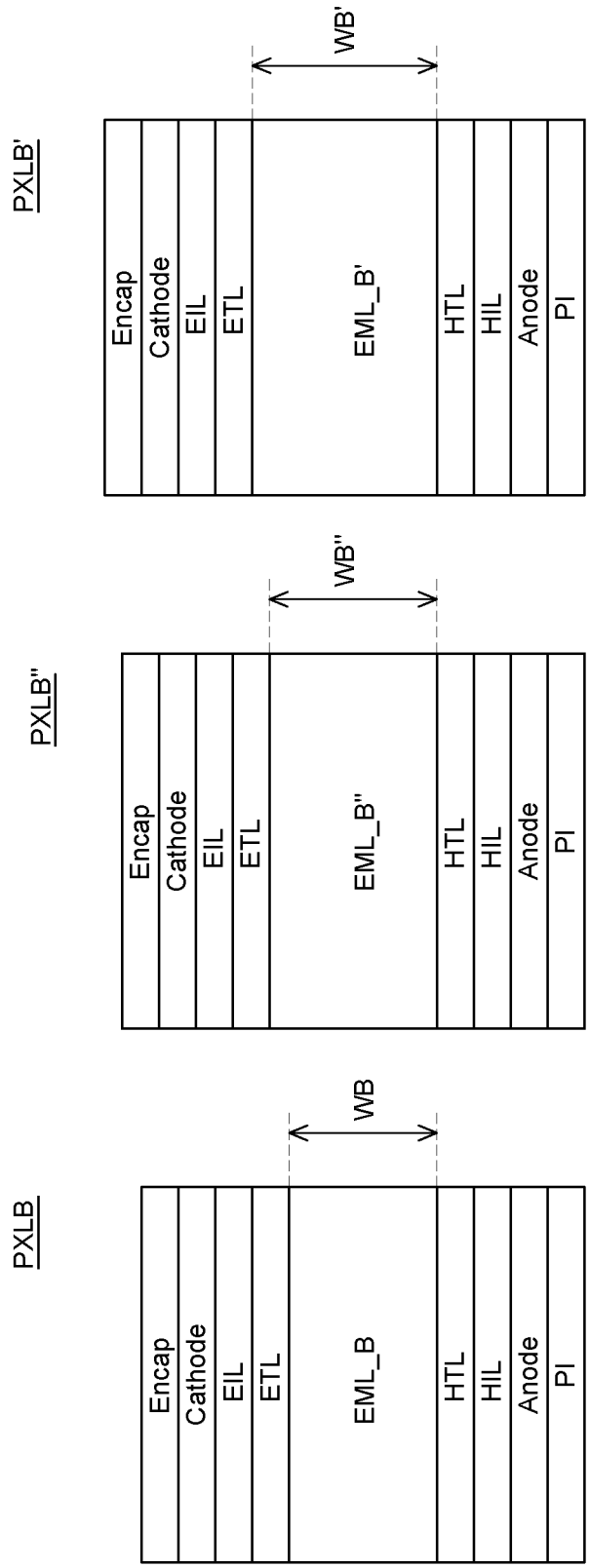
FIG. 8 is a cross-sectional view for explaining a structure of blue sub pixels of a first folding area, a second folding area, and a non-folding area of FIG. 5.

FIG. 6 is a cross-sectional view for explaining a structure of red sub pixels of a first folding area, a second folding area, and a non-folding area of FIG. 5. FIG. 7 is a cross-sectional view for explaining a structure of green sub pixels of a first folding area, a second folding area, and a non-folding area of FIG. 5. FIG. 8 is a cross-sectional view for explaining a structure of blue sub pixels of a first folding area, a second folding area, and a non-folding area of FIG. 5. According to some embodiments, the second folding area FA2 may be between the first folding area FA1 and an area outside the folding area.

The red sub pixel PXLR of the non-folding area NFA may be configured to include a red light emitting layer EML_R having a first thickness WR. The red sub pixel PXLR' of the first folding area FA1 may be configured to include a red light emitting layer EML_R' having a second thickness WR'. The red sub pixel PXLR" of the second folding area FA2 may be configured to include a red light emitting layer EML_R" having a third thickness WR".

The green sub pixel PXLG of the non-folding area NFA may be configured to include a green light emitting layer EML_G having a first thickness WG. The green sub pixel PXLG' of the first folding area FA1 may be configured to include a green light emitting layer EML_G' having a second thickness WG'. The green sub pixel PXLG" of the second folding area FA2 may be configured to include a green light emitting layer EML_G" having a third thickness WG".

The blue sub pixel PXLB of the non-folding area NFA may be configured to include a blue light emitting layer EML_B having a first thickness WB. The blue sub pixel PXLB' of the first folding area FA1 may be configured to include a blue light emitting layer EML_B' having a second thickness WB'. The blue sub pixel PXLB" of the second folding area FA2 may be configured to include a blue light emitting layer EML_B" having a third thickness WB".

When the thickness of the light emitting layer of the sub pixels disposed in the folding area is increased in accordance to the strength of the stress, the thickness of each sub pixel is increased in accordance to the strength of the folding stress. Therefore, the parasitic capacitance due to the folding stress may be reduced. Therefore, the luminance lowering problem which may be generated in the folding area FA may be reduced.

For example, the thickness of the red sub light emitting layer EML_R of the non-folding area NFA may be 45 nm, but the present disclosure is not limited thereto. In this case, the thickness of the red light emitting layer EML_R" of the second folding area FA2 may be 49.4 nm to 51.75 nm. Further, the thickness of the red light emitting layer EML_R' of the first folding area FA1 may be 51.75 nm to 53.55 nm. According to the above-described configuration, even though the thickness of the light emitting layer is increased in the first and second folding areas FA1 and FA2 in accordance to the stress, the luminance difference of the red sub pixels in the first and second folding areas FA1 and FA2 and the red sub pixels in the non-folding area NFA may be reduced.

For example, the thickness of the green sub light emitting layer EML_G of the non-folding area NFA may be 40 nm, but the present disclosure is not limited thereto. In this case, the thickness of the green light emitting layer EML_G" of the second folding area FA2 may be 43.3 nm to 43.6 nm. Further, the thickness of the green light emitting layer EML_G' of the first folding area FA1 may be 43.6 nm to 44 nm. According to the above-described configuration, even though the thickness of the light emitting layer is increased in the first and second folding areas FA1 and FA2 in accordance to the stress, the luminance difference of the green sub pixels in the first and second folding areas FA1 and FA2 and the green sub pixels in the non-folding area NFA may be reduced.

For example, the thickness of the blue sub light emitting layer EML_B of the non-folding area NFA may be 23 nm, but the present disclosure is not limited thereto. In this case, the thickness of the blue light emitting layer EML_B" of the second folding area FA2 may be 24.84 nm to 25.3 nm. Further, the thickness of the blue light emitting layer EML_B' of the first folding area FA1 may be 25.3 nm to 25.76 nm. According to the above-described configuration, even though the thickness of the light emitting layer is increased in the first and second folding areas FA1 and FA2 in accordance to the stress, the luminance difference of the blue sub pixels in the first and second folding areas FA1 and FA2 and the blue sub pixels in the non-folding area NFA may be reduced.

For example, a difference of average aperture ratios of sub pixels of the folding area FA and the non-folding area NFA may be about 8% to 12% so that the aperture ratio in the folding area FA is lower than that in the non-folding area NFA.

That is, when the thickness of the light emitting layer of the folding area is increased in accordance to the stress, the parasitic capacitance between the anode and the cathode may be reduced so that the luminance reduction may not be as significant.

Figure 9:
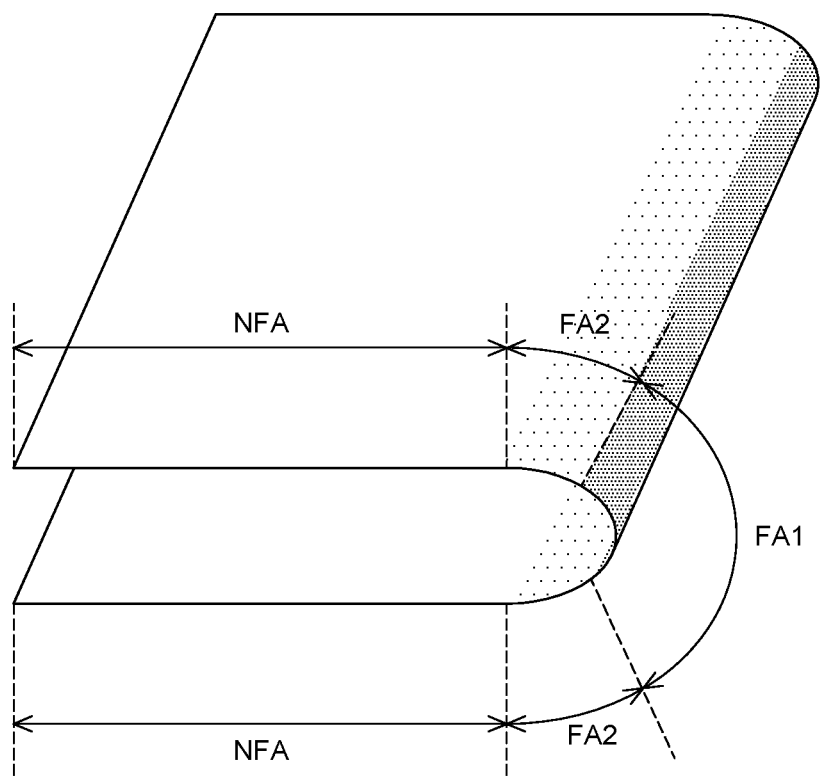
FIG. 9 is a conceptual view for schematically explaining a folding stress of a foldable display apparatus according to an exemplary embodiment of the present disclosure.

FIG. 9 is a conceptual view for schematically explaining a stress of a foldable display apparatus according to an exemplary embodiment of the present disclosure. In FIG. 9, an amount of the stress is schematically illustrated with a hatching density.

Referring to FIG. 9, it is illustrated that in the foldable display panel 130, the folding stress is not substantially generated in the non-folding area NFA. Further, it is further illustrated that the folding stress starts to be generated in the second folding area FA2 adjacent to the non-folding area NFA. Further, it is illustrated that the folding stress is further increased in the first folding area FA1 adjacent to the second folding area FA2. Therefore, when the aperture ratio and/or the thickness of the light emitting layer of all sub pixels are the same, the parasitic capacitance in the first folding area FA1 may be increased more than the second folding area FA2 due to the folding stress. Therefore, when the aperture ratio and/or the thickness of the light emitting layer of all sub pixels are the same, the parasitic capacitance between the anode and the cathode may be increased in the second folding area FA2 more than in the non-folding area NFA, due to the folding stress.

In some exemplary embodiments, the foldable display apparatus 100 may be configured to include a foldable display panel 130, a back plate, a cover window, and the like, but the present disclosure is not limited thereto. The cover window may be disposed above the foldable display panel 130. The cover window may protect the foldable display panel 130 from impacts, moisture, heat, and the like from the outside. The cover window is formed of a glass having a foldable thickness. The back plate is provided below the foldable display panel 130. When a substrate of the foldable display panel 130 is formed of a plastic material such as polyimide (PI), the manufacturing process of the foldable display apparatus 100 is performed under a circumstance in which a support substrate formed of glass is disposed below the substrate. After manufacturing the foldable display panel 130 on the support substrate, the support substrate may be released. The support substrate may be a glass substrate. However, a component for supporting the substrate is necessary even after releasing the support substrate, so that a back plate for supporting the substrate may be disposed below the substrate, but is not limited thereto. The back plate may protect the foldable display panel 130 from moisture, heat, impacts, and the like from the outside. The back plate and the foldable display panel 130 may be attached by the adhesive layer. The adhesive layer may be disposed between the cover window and the foldable display panel 130 and between the foldable display panel 130 and the back plate. For example, the adhesive layer may be formed of an optical clear adhesive (OCA) or a pressure sensitive adhesive (PSA), but is not limited thereto.

In some exemplary embodiments, an anti-fingerprint layer may be disposed on the cover window. The anti-fingerprint layer may minimize a trace remaining on an upper surface of the cover window. The anti-fingerprint layer may be coated to be provided on the upper surface of the cover window. The anti-fingerprint layer may be formed by coating a fluorine compound having a low surface energy on the cover window.

In some exemplary embodiments, the cover window may be an etched thin tempered glass.

In some exemplary embodiments, a polarizing plate may be disposed above the foldable display panel 130. The polarizing plate selectively transmits light to reduce the reflection of external light which is incident onto the foldable display panel 130. The polarizing plate may be a circular polarizing plate. Specifically, the foldable display panel 130 includes various metal layers applied to a thin film transistor, a wiring line, an electroluminescent element, and the like. Therefore, the external light incident onto the foldable display panel 130 may be reflected from the metal layer and the visibility of the foldable display apparatus 100 may be reduced due to the reflection of the external light. However, when the polarizing plate is disposed, the polarizing plate absorbs the external light to increase an ambient contrast ratio of the foldable display apparatus 100.

In some exemplary embodiments, a touch panel may be further disposed between the foldable display panel 130 and the cover window. The touch panel is a device which senses a screen touch on the foldable display apparatus 100 or a touch input of the user such as a gesture and may be a resistive type, a capacitive type, an optical type, or an electromagnetic type.

The exemplary embodiments of the present disclosure can also be described as follows:

According to an aspect of the present disclosure, a foldable display apparatus comprises a non-folding area in which some of a plurality of red sub pixels, a plurality of green sub pixels, and a plurality of blue sub pixels is disposed; and a folding area in which the remaining of the plurality of red sub pixels, the plurality of green sub pixels, and the plurality of blue sub pixels is disposed, wherein an aperture ratio of the plurality of red sub pixels of the folding area is lower than an aperture ratio of the plurality of red sub pixels of the non-folding area, an aperture ratio of the plurality of green sub pixels of the folding area is lower than an aperture ratio of the plurality of green sub pixels of the non-folding area, and an aperture ratio of the plurality of blue sub pixels of the folding area is lower than an aperture ratio of the plurality of blue sub pixels of the non-folding area.

The plurality of red sub pixels may include a red light emitting layer and a thickness of the red light emitting layer of the plurality of red sub pixels of the non-folding area is smaller than a thickness of the red light emitting layer of the plurality of red sub pixels of the folding area.

The plurality of green sub pixels may include a green light emitting layer and a thickness of the green light emitting layer of the plurality of green sub pixels of the non-folding area is smaller than a thickness of the green light emitting layer of the plurality of green sub pixels of the folding area.

The plurality of blue sub pixels may include a blue light emitting layer and a thickness of the blue light emitting layer of the plurality of blue sub pixels of the non-folding area is smaller than a thickness of the blue light emitting layer of the plurality of blue sub pixels of the folding area.

Thicknesses of the light emitting layers of the plurality of red sub pixels, the plurality of green sub pixels, and the plurality of blue sub pixels of the folding area may be 8% to 19% larger than thicknesses of the light emitting layers of the plurality of red sub pixels, the plurality of green sub pixels, and the plurality of blue sub pixels of the non-folding area.

The folding area may include a first folding area and a second folding area between the first folding area and the non-folding area, and aperture ratios of the plurality of red sub pixels, the plurality of green sub pixels, and the plurality of blue sub pixels of the first folding area may be lower than aperture ratio of the plurality of red sub pixels, the plurality of green sub pixels, and the plurality of blue sub pixels of the second folding area.

Anodes and cathodes of the plurality of red sub pixels, the plurality of green sub pixels, and the plurality of blue sub pixels of the folding area may be configured to increase a parasitic capacitance due to the stress when the foldable display apparatus is folded and light emitting layers of the plurality of red sub pixels, the plurality of green sub pixels, and the plurality of blue sub pixels of the folding area may be configured to reduce of the increase of the parasitic capacitance due to the stress when the foldable display apparatus is folded.

According to another aspect of the present disclosure, a foldable display apparatus comprises a substrate including a non-folding area and a folding area; and a plurality of sub pixels which are defined in the non-folding area and the folding area on the substrate and includes a plurality of light emitting diodes, wherein the plurality of sub pixels is configured to emit at least one color light, and a thickness of the plurality of light emitting diodes of the plurality of sub pixels of the folding area is larger than a thickness of the plurality of light emitting diodes of the plurality of sub pixels of the non-folding area which emits corresponding color light.

The plurality of sub pixels may be configured to emit any one of red, green, and blue light.

The folding area may include a first folding area and a second folding area between the first folding area and the non-folding area, and a thickness of the plurality of light emitting diodes of the plurality of sub pixels of the first folding area may be larger than a thickness of the plurality of light emitting diodes of the plurality of sub pixels of the second folding area.

A thickness of light emitting layers of the plurality of light emitting diodes of the plurality of sub pixels of the folding area may be larger than a thickness of light emitting layers of the plurality of light emitting diodes of the plurality of sub pixels of the non-folding area.

An aperture ratio of the plurality of sub pixels of the folding area may be lower than an aperture ratio of the plurality of sub pixels of the non-folding area.

According to yet another aspect of the present disclosure, a foldable display apparatus comprises a non-folding area in which some of a plurality of sub pixels including light emitting layers is disposed; and a folding area in which the remaining of the plurality of sub pixels is disposed, wherein an aperture ratio of the plurality of sub pixels of the folding area is lower than an aperture ratio of the plurality of sub pixels of the non-folding area, and a thickness of the light emitting layers of the plurality of sub pixels of the folding area is larger than a thickness of the light emitting layers of the plurality of sub pixels of the non-folding area.

The plurality of sub pixels may be configured to emit any one of red, green, and blue light.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display apparatus, comprising:
a substrate including a folding area;
a plurality of sub pixels on the substrate, the plurality of sub pixels including a plurality of red sub pixels, a plurality of green sub pixels, and a plurality of blue sub pixels,
wherein at least one of the plurality of red sub pixels, the plurality of green sub pixels, or the plurality of blue sub pixels includes a first subset of sub pixels disposed in an area outside the folding area with a first aperture ratio, and a second subset of sub pixels disposed in the folding area with a second aperture ratio lower than the first aperture ratio,
wherein each of the plurality of sub pixels includes:
an anode;
a cathode; and
a light emitting layer between the anode and the cathode, and
wherein an aperture ratio of a sub pixel in the plurality of sub pixels indicates a ratio between a light emitting area where the anode and the cathode of the sub pixel overlap and an area of the sub pixel.

2. The foldable display apparatus according to claim 1, wherein each of the plurality of red sub pixels includes a red light emitting layer,
wherein the at least one is the plurality of red sub pixels, and wherein a first thickness of the red light emitting layers of the first subset of sub pixels is smaller than a second thickness of the red light emitting layers of the second subset of sub pixels.

3. The foldable display apparatus according to claim 2, wherein the second aperture ratio is between 11.7% and 12.8%.

4. The foldable display apparatus according to claim 2, wherein the second thickness is between 49.4 nm to 53.55 nm.

5. The foldable display apparatus according to claim 1, wherein each of the plurality of green sub pixels includes a green light emitting layer,
wherein the at least one is the plurality of green sub pixels, and
wherein a thickness of the green light emitting layers of the first subset of sub pixels is smaller than a thickness of the green light emitting layers of the second subset of sub pixels.

6. The foldable display apparatus according to claim 5, wherein the second aperture ratio is between 21.2% and 22.35%.

7. The foldable display apparatus according to claim 5, wherein the second thickness is between 43.3 nm to 44 nm.

8. The foldable display apparatus according to claim 1, wherein each of the plurality of blue sub pixels includes a blue light emitting layer,
wherein the at least one is the plurality of blue green sub pixels, and
wherein a thickness of the blue light emitting layers of the first subset of sub pixels is smaller than a thickness of the blue light emitting layers of the second subset of sub pixels.

9. The foldable display apparatus according to claim 8, wherein the second aperture ratio is between 23.5% and 25%.

10. The foldable display apparatus according to claim 8, wherein the second thickness is between 23 nm to 27 nm.

11. The foldable display apparatus according to claim 1, wherein
a thickness of the light emitting layers of the second subset of sub pixels is 8% to 19% larger than a thickness of the light emitting layers of the first subset of sub pixels.

12. The foldable display apparatus according to claim 1, wherein the folding area includes a first folding area and a second folding area between the first folding area and the area outside the folding area,
wherein the second subset of subpixels is disposed in the first folding area, and
wherein the at least one further includes a third subset of sub pixels disposed in the second folding area with a third aperture ratio larger than the second aperture ratio.

13. The foldable display apparatus according to claim 12, wherein
a second thickness of the light emitting layers of the second subset of sub pixels is larger than a third thickness of the light emitting layers of the third subset of sub pixels, and the third thickness is larger than a first thickness of the light emitting layers of the first subset of sub pixels.

14. The foldable display apparatus according to claim 1, wherein
the anodes and the cathodes of the second subset of sub pixels are configured to increase a parasitic capacitance due to stress when the foldable display apparatus is folded, and
the light emitting layers of the second subset of sub pixels are configured to reduce the increase of the parasitic capacitance due to the stress when the foldable display apparatus is folded.

15. A foldable display apparatus, comprising:
a substrate including a folding area; and
a plurality of sub pixels on the substrate, the plurality of sub pixels including:
a first subset of sub pixels in an area outside the folding area, the first subset of sub pixels configured to emit a color of light, and
a second subset of sub pixels in the folding area on the substrate, the second subset of sub pixels configured to emit the color of light, each of the plurality of sub pixels including a light emitting diode,
wherein the light emitting diode of each of the plurality of sub pixels includes a light emitting layer, and
a second thickness of the light emitting layers of the second subset of sub pixels in the folding area is larger than a first thickness of the light emitting layers of the first subset of sub pixels in the area outside the folding area.

16. The foldable display apparatus according to claim 15, wherein the color of light corresponds to any one of red, green, and blue light.

17. The foldable display apparatus according to claim 15, wherein the folding area includes a first folding area and a second folding area between the first folding area and the area outside the folding area,
wherein the second subset of sub pixels is in the first folding area,
wherein the plurality of sub pixels further includes a third subset of sub pixels in the second folding area on the substrate, the third subset of sub pixels configured to emit the color of light, and
wherein the second thickness is larger than a third thickness of the light emitting layers of the third subset of sub pixels in the second folding area.

18. The foldable display apparatus according to claim 17, wherein the third thickness is larger than the first thickness.

19. The foldable display apparatus according to claim 15, wherein a second aperture ratio of the second subset of sub pixels in the folding area is lower than a first aperture ratio of the first subset of sub pixels in the area outside the folding area.

* * * * *